(12) United States Patent
Kurumaddali (10) Patent No.: US 10,224,660 B2
(45) Date of Patent: Mar. 5, 2019

(54) THREADED CIRCUIT BOARD

(71) Applicant: Microsoft Technology Licensing, LLC, Redmond, WA (US)

(72) Inventor: Kanth Kurumaddali, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 59 days.

(21) Appl. No.: 15/296,967

(22) Filed: Oct. 18, 2016

(65) Prior Publication Data

US 2018/0109026 A1 Apr. 19, 2018

(51) Int. Cl.
*H01R 13/62* (2006.01)
*H01R 13/24* (2006.01)
*H01R 4/30* (2006.01)
*H01R 12/70* (2011.01)

(52) U.S. Cl.
CPC ......... *H01R 13/2421* (2013.01); *H01R 4/307* (2013.01); *H01R 12/7005* (2013.01); *H01R 12/7082* (2013.01)

(58) Field of Classification Search
CPC .............................. F16B 5/00; H01R 13/2421
USPC .......................................................... 439/253
See application file for complete search history.

(56) References Cited

U.S. PATENT DOCUMENTS

| 5,239,135 A * | 8/1993 | Phillips, II | H05K 3/301 174/267 |
| 6,416,332 B1 * | 7/2002 | Carron | H01R 4/024 439/331 |
| 7,524,196 B2 | 4/2009 | Bond | |
| 7,593,239 B2 * | 9/2009 | Li | H05K 7/142 361/803 |
| 7,604,491 B1 * | 10/2009 | Ahmad | H05K 3/308 439/82 |
| 8,014,159 B2 | 9/2011 | Doblar et al. | |
| 8,210,854 B2 * | 7/2012 | Orris | H01R 12/7088 361/804 |
| 8,632,346 B2 * | 1/2014 | Wittig | H01R 4/184 439/553 |
| 2003/0201120 A1 * | 10/2003 | Forte | H05K 7/142 174/255 |

(Continued)

FOREIGN PATENT DOCUMENTS

| CN | 201142303 Y | 10/2008 |
| CN | 204069495 U | 12/2014 |

(Continued)

OTHER PUBLICATIONS

Petrilla, Attila, "How to Fix PCB without Soldering (Technics SX-K700 keyboard)", Published on: Dec. 26, 2011 Available at: http://apetrilla.blogspot.in/2011/12/how-to-fix-pcb-without-soldering.html.

(Continued)

*Primary Examiner* — Abdullah Riyami
*Assistant Examiner* — Nader Alhawamdeh
(74) *Attorney, Agent, or Firm* — Holzer Patel Drennan (57) ABSTRACT

A circuit board disclosed herein includes a threaded receptor, one or more alignment holes, and one or more pads. The threaded receptor is configured to receive a component with a threaded screw. Each of the one or more alignment holes are configured to receive an alignment pin located on the component. Each of the one or more pads are configured to electrically connect to a pogo pin on the component.

19 Claims, 6 Drawing Sheets

(56) References Cited

U.S. PATENT DOCUMENTS

| | | | | |
|---|---|---|---|---|
| 2009/0301768 A1* | 12/2009 | Liu | ................. | H05K 1/0215 |
| | | | | 174/257 |
| 2013/0148319 A1 | 6/2013 | Li | | |
| 2013/0189049 A1 | 7/2013 | Stotz | | |
| 2015/0342075 A1* | 11/2015 | Oki | ................. | G01J 1/44 |
| | | | | 250/206 |
| 2016/0104956 A1* | 4/2016 | Santos | ............. | H01R 9/0518 |
| | | | | 324/754.03 |
| 2016/0273564 A1* | 9/2016 | Bonicatto | ......... | H01R 12/7047 |

FOREIGN PATENT DOCUMENTS

| | | |
|---|---|---|
| CN | 204090279 U | 1/2015 |
| CN | 204616192 U | 9/2015 |
| WO | 2012152042 A1 | 11/2012 |
| WO | 2014044114 A1 | 3/2014 |

OTHER PUBLICATIONS

"Harting Han-Fast® Lock provides solder-free circuit board connection", Published on: Apr. 14, 2013 Available at: http://www.ept.ca/2013/04/harting-han-fast%C2%AE-lock-provides-solder-free-circuit-board-connection/.

Cook, David, "Yummy Floor Sensor Board", Published on: Oct. 17, 2012 Available at: http://www.robotroom.com/Yummy-Robot-4.html.

"Mounting hole on a PCB", Published on: Nov. 17, 2014 Available at: http://electronics.stackexchange.com/questions/137394/mounting-hole-on-a-pcb.

* cited by examiner

FIG. 6

THREADED CIRCUIT BOARD

BACKGROUND

Many devices include one or more components that are connected to each other using printed circuit boards (PCBs). For example, a computing device may include a number of components, such as controllers, microprocessors, memory, that are implemented as integrated circuits (ICs). One or more of these ICs are electrically connected to PCBs using wire bonds or solder joints. The wire bonds may be very thin wires extending from contact pads along sides of the ICs to contacts on the PCB. A computing device may include hundreds of such ICs mounted on the PCB.

SUMMARY

A circuit board disclosed herein includes a threaded receptor, one or more alignment holes, and one or more pads. The threaded receptor is configured to receive a component with a threaded screw. Each of the one or more alignment holes are configured to receive an alignment pin located on the component. Each of the one or more pads are configured to electrically connect to a pogo pin on the component.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Other implementations are also described and recited herein.

BRIEF DESCRIPTIONS OF THE DRAWINGS

Example implementations are illustrated in referenced figures of the drawings. It is intended that the implementations and figures disclosed herein are to be considered illustrative rather than restrictive.

DETAILED DESCRIPTIONS

As utilized herein, terms "component," "system," "interface," and the like are intended to refer to a computer-related entity, either hardware, software (e.g., in execution), and/or firmware. For example, a component can be a process running on a processor, a processor, an object, an executable, a program, an app, and/or a computer (which may also be a mobile device). By way of illustration, both an application running on a server and the server can be a component. One or more components can reside within a process and a component can be localized on one computer and/or distributed between two or more computers.

The claimed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the claimed subject matter may be practiced without these specific details. In other instances, well-known structures and devices are shown in block diagram form in order to facilitate describing the subject innovation.

Modern computing devices include a large number of integrated circuits (ICs) mounted on printed circuit boards (PCBs). For example, a computer may include a PCB known as the motherboard that has various microprocessors, controllers, memory chips, and other components attached in the motherboard. Each of these components may be formed as an IC and they are mounted on the motherboard by soldering wire bonds extending from contact pads along the side of the ICs to contacts on the motherboard. Alternatively, contact pads may be connected to the motherboard using solder joints. Such soldering process is expensive, time consuming, and prone to mistakes. Furthermore, once a component is soldered onto a PCB, removing the component from the PCB requires de-soldering of the wire bonds or solder joints, which again is expensive, time consuming, and prone to mistakes.

The technology disclosed herein provides a threaded PCB that includes threaded receptors to connect components to the PCB. The threaded receptor may be configured to have female threads along its internal periphery. A component with a screw type threaded connector may be connected to the PCB by screwing in the threaded connector to the threaded receptor of the PCB. For example, the threaded connector of the component may have male threads along its outer periphery.

The threaded PCB also includes one or more alignment holes that can be used to align the threaded component to a predetermined position on the PCB. The alignment holes of the PCB may receive alignment pins that are located on the bottom surface of the component. Additionally, the component may include a plurality of connector pins along its bottom surface to communicate a signal from the component to the PCB. For example, such connector pins may be pogo pins. The PCB may also include various pads to communicate with the connector pins. For example, the PCB may include various pads that electrically connect to the connector pins. Alternatively, the PCB may include various pads that optically communicate with the connector pins.

The combination of the threaded PCB and components having threaded connectors allows connecting components to the PCB by simply threading the threaded connectors to the threaded receptor. This allows for easy and quick attaching and removing components from the PCB.

Figure 1:
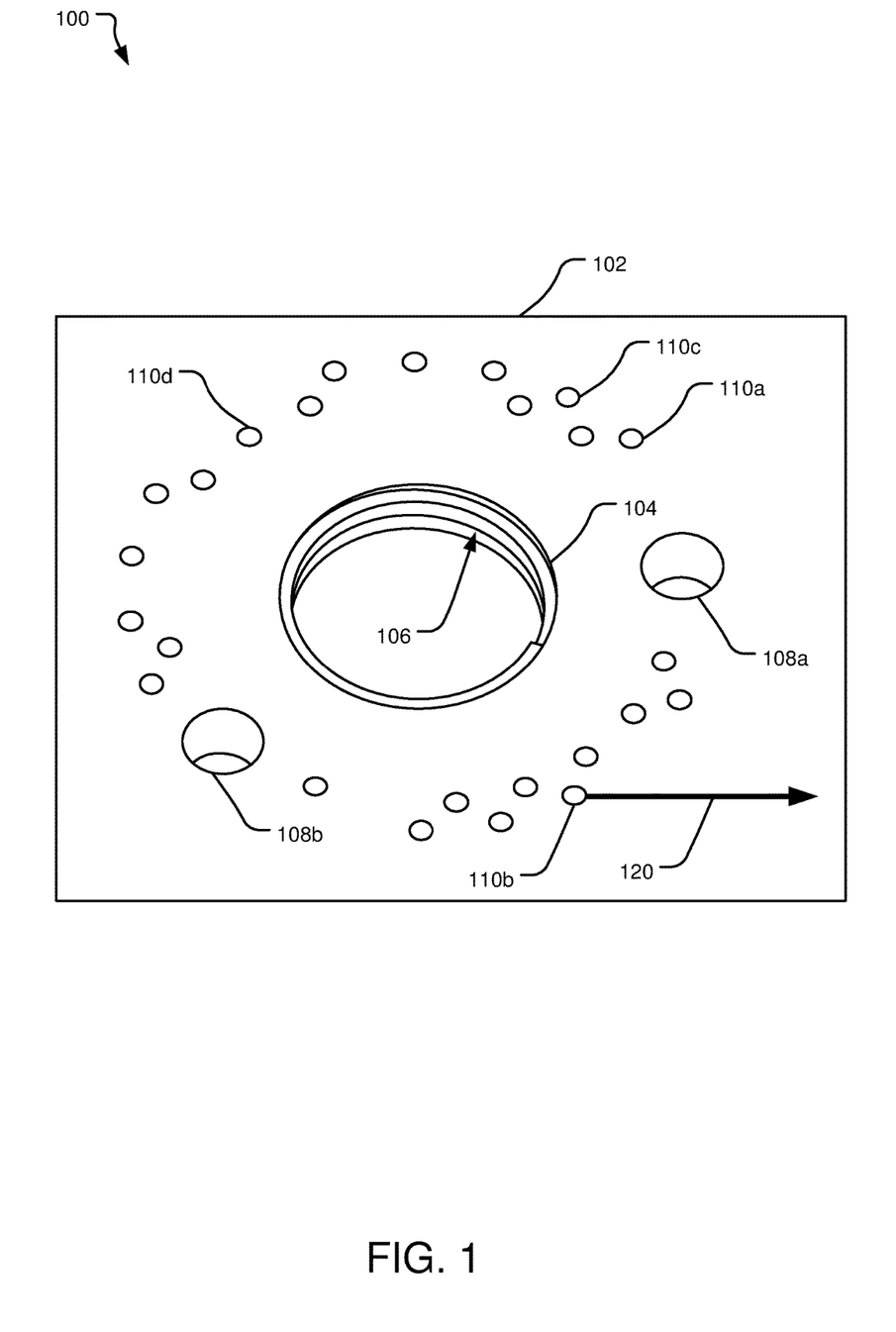
FIG. 1 illustrates an example implementation of a circuit board with a threaded receptor.

FIG. 1 illustrates an example implementation of a circuit board 100 with a threaded receptor. Specifically, the circuit board 100 includes a PCB 102 with a threaded receptor 104. The threaded receptor 104 may be provided with female threads 106 along its inner periphery. In one implementation, the threaded receptor 104 may span the entire thickness of the PCB 102. In an alternative implementation, the threaded receptor 104 may span the thickness of the PCB 102 only partially. While PCB 102 is shown to have only one threaded receptor 104, alternative implementation of the PCB 102 may have a number of threaded receptor 104, each of the threaded receptors 104 configured to receive a separate component.

The PCB 102 also includes two alignment holes 108a, 108b (referred to collectively as "alignment holes 108"). The alignment holes 108 may be used to align a component on the surface of the PCB 102 before the components is screwed into the PCB 102. While the illustrated implementation of the PCB 102 includes two alignment holes 108, alternatively, only one or more than two alignment holes 108 may be used to align a component on the PCB 102. The alignment holes 108 may also span part of the entire thickness of the PCB 102. Furthermore, while the alignment holes 108 are shown to be circular in shape, in alternative implementations, the alignment holes 108 may be of another shape, such as square or triangular.

The PCB 102 also includes a number of pads 110a, 110b, 110c, 110d (referred to collectively as pads 110). The pads 110 may be electrical pads that are connected to other circuit components of the PCB 102. For example, the pad 110b may be electrically connected to a trace 120 that connects the pad 110b to other circuit components of the PCB 102. The pads 110 may have electrically conductive top surfaces that electrically connects to connector pins located on a bottom surface of a component that is threaded into the threaded receptor 104. For example, the top surface of the pads 110 may electrically connect to pogo pins located on the bottom surface of a component that is threaded into the threaded receptor 104.

Alternatively, the top surface of the pads 110 may be made of material that receives optical signals from connector pins located on the bottom surface of a component that is threaded into the threaded receptor 104. In such an implementation, the pads 110 may be connected to transducers (not shown) that convert the optical signals from the connector pins into electrical signals and communicate them via the traces, such as the trace 120, of the PCB 102. Furthermore, the pads 102 may also include transducers (not shown) that convert electrical signals coming from the traces, such as the trace 120, into an optical signal and communicate it to the connector pins located on the bottom surface of a component that is threaded into the threaded receptor 104.

Figure 2:
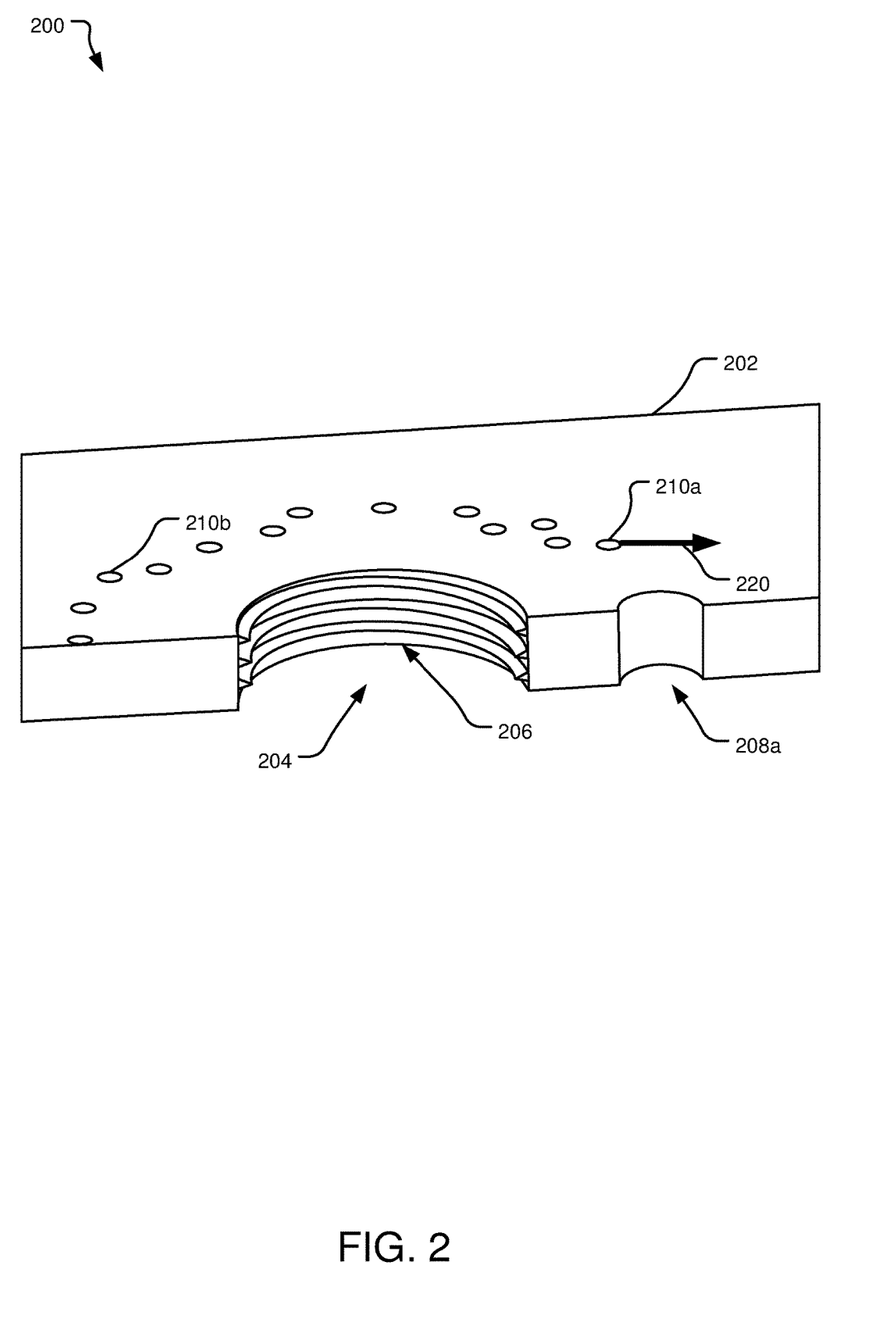
FIG. 2 illustrates an alternative view of an example implementation of a circuit board with a threaded receptor.

FIG. 2 illustrates an alternative view of an example implementation of a circuit board 200 with a threaded receptor. Specifically, FIG. 2 discloses a PCB 202 having a threaded receptor 204 having female threads 206 along its internal periphery. While FIG. 2 illustrates the threaded receptor 204 spanning the entire thickness of the PCB 202, in an alternative implementation, the threaded receptor 204 may span less than the entire thickness of the PCB 202. The PCB 202 also illustrates a cross-sectional view of an alignment hole 208a that is configured to receive alignment pins located on bottom surface of component that is threaded into the threaded receptor 204.

Furthermore, the PCB 202 also includes a number of pads 210a, 210b (referred to collectively as pads 210). Each of the pads 210 may have an electrically conductive top surface that electrically connects to connector pins located on a bottom surface of a component that is threaded into the threaded receptor 204. For example, the top surface of the pads 210 may electrically connect to pogo pins located on the bottom surface of a component that is threaded into the threaded receptor 204. While the pads 210 are also disclosed as spanning the entire thickness of the PCB 202, in alternative implementations, the pads 210 may only span partial thickness of the PCB 202. The pads 210 may be electrical pads that are connected to other circuit components of the PCB 202. For example, the pad 210a may be electrically connected to a trace 220 that connects the pad 210a to other circuit components of the PCB 202.

Figure 3:
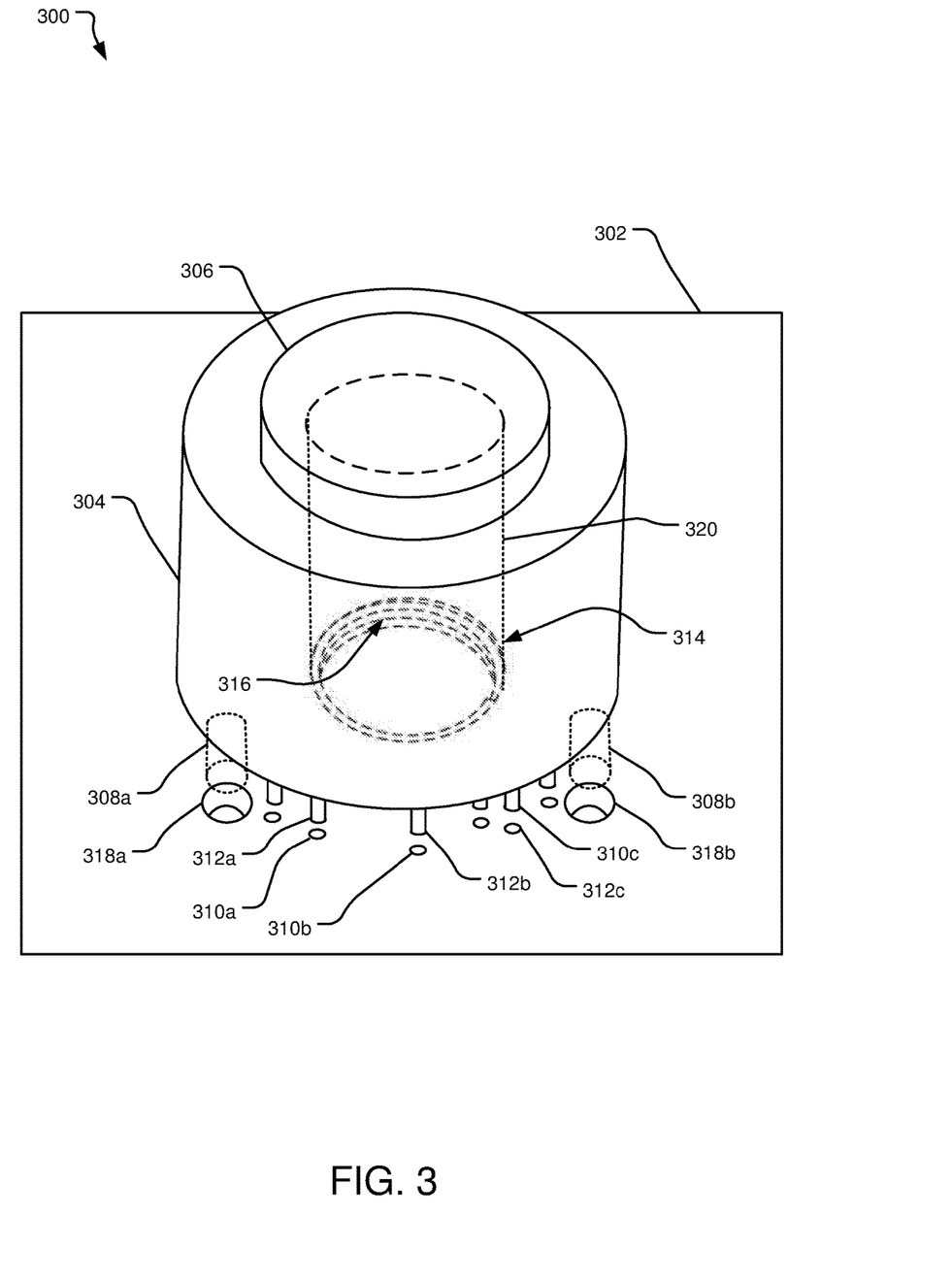
FIG. 3 illustrates an example component that may be threaded into the threaded circuit board disclosed herein.

FIG. 3 illustrates an example component 300 that may be threaded into the threaded circuit board disclosed herein. Specifically, FIG. 3 discloses a component 304 that may be attached to a threaded PCB 302. The threaded PCB 302 may have a threaded receptor 314 having female threads 316 along its outer periphery. The component 304 includes a threaded connector 306 that may have a bottom part (such as that indicated by threaded connector 406 in FIG. 4) with male threads on its outer periphery. The threaded connector 306 may be threaded into the threaded receptor 314 of the PCB 302 so as to connect the component 304 to the PCB 302.

The component 304 also has one or more alignment pins 308a, 308b (referred to collectively as alignment pins 308) that may be aligned with one or more alignment holes 318a, 318b (referred to collectively as alignment holes 318) so as to align the component 304 with the PCB 302. Furthermore, the component 304 includes various connector pins 312a, 312b, 312c (referred to collectively as connector pins 312) that may make connections with various pads 310a, 310b, 310c (referred to collectively as pads 310).

In one implementation, the component 304 includes a number of connector pins 312 attached to its bottom surface. The connector pins 312 may be connected internally to various electronic components or electrical terminals within the component 304. For example, the connector pins 312 may be pogo pins where each connector pin 312 is connected to an electronic component or an electrical terminal within the component 304. Alternatively, the connector pins 312 may include other spring mechanism to ensure conductive contact between the bottom surface of the connector pins 312 and the pads 310. The pads 310 may be connected via electrical traces to other components of the PCB 302.

The component 304 may also include a cavity 320 with its periphery having female threads. The threaded connector 306 may be threaded via the cavity 320 into the threaded receptor 314. Thus, the threaded connector 306 attaches the component 304 to the PCB 302.

In one implementation, the threaded receptor 314 may be set as the ground terminal of the PCB 302. In such an implementation, the threaded connector 306 may also be set to be the ground terminal of the component 304. As a result, when the threaded connector 306 is screwed into the threaded receptor 314, the component 304 is grounded.

Figure 4:
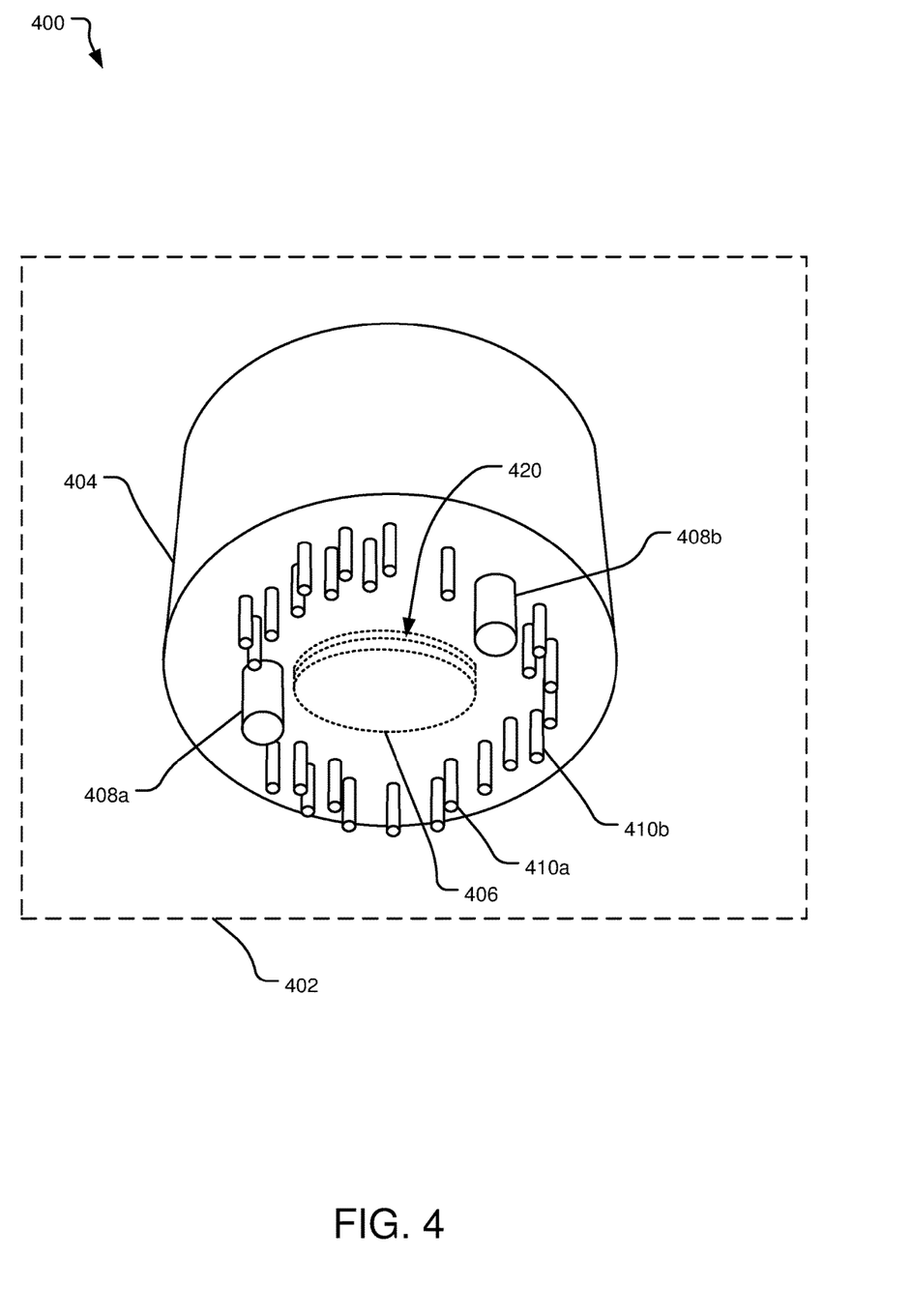
FIG. 4 illustrates an alternative example component that may be threaded into the threaded circuit board disclosed herein.

FIG. 4 illustrates an alternative example component 400 that may be threaded into the threaded circuit board disclosed herein. Specifically, FIG. 4 illustrates a bottom view of a threaded component 404 that may be threaded into a threaded PCB 402. The threaded component 404 is illustrated to include a threaded connector 406 having male threads 420 around its external periphery. The threaded connector 406 may be threaded into a threaded receptor (such as the receptor 204 of FIG. 2) having female threads.

The threaded component 404 also includes various connector pins 410a, 410b (referred to collectively as connector pins 410) located on its bottom surface. The connector pins 410 may be, for example, pogo pins. The connector pins 410 may have an electrically conductive bottom surface to communicate a signal to and from a pad (such as pads 110 shown in FIG. 1) on the PCB 402.

The threaded component 404 also includes one or more alignment pins 408a, 408b (referred to collectively as alignment pins 408). The alignment pins 408 may be used to align the threaded component 404 to the PCB 402 such that the connector pins 410 are aligned with pads (such as pads 110 shown in FIG. 1) on the PCB 402. The threaded component 404 may be aligned to the PCB 402 using the alignment pins 408 and after such alignment, the threaded component 404 may be fastened to the PCB 402 using the threaded connector 406, which is screwed into the threaded receptor of the PCB 402.

Figure 5:
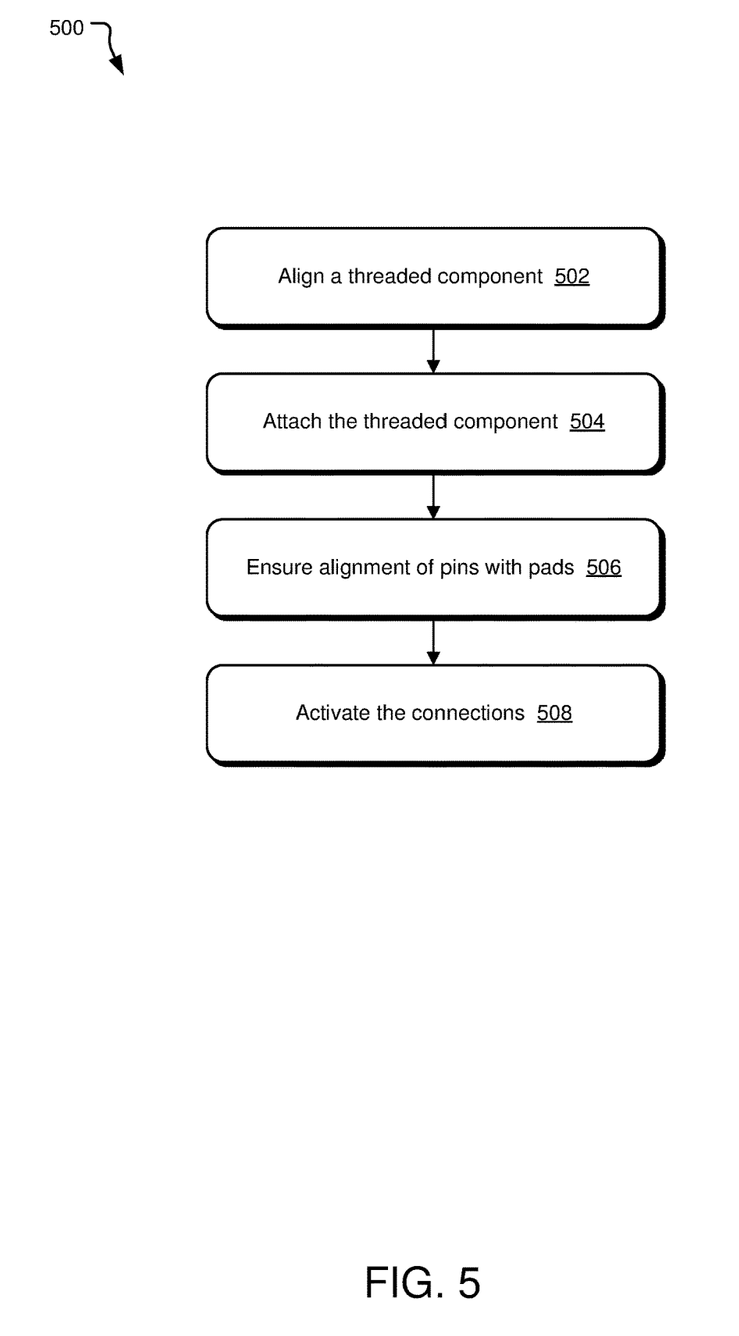
FIG. 5 illustrates example operations for using the threaded circuit board disclosed herein.

FIG. 5 illustrates example operations 500 for using a threaded circuit board disclosed herein. An operation 502 may align a threaded component with the threaded circuit board. For example, one or more alignment pins on the threaded component may be used together with one or more alignment holes in the threaded circuit board to align the threaded component to the threaded circuit board. An operation 504 attaches the threaded component to the threaded circuit board. For example, a threaded connector of the threaded component may be screwed into a threaded receptor on the threaded circuit board to attach the threaded component to the threaded circuit board. An operation 506 confirms alignment of various connector pins on the threaded component to various pads on the threaded circuit board. For example, the operation 506 may perform such confirmation by sending a confirmation signal from one or more of the connector pins and ensuring that the confirmation signal is received by the appropriate pads on the threaded circuit board. Once the alignment is confirmed, an operation 508 activates the connections between the threaded component and the threaded circuit board.

Figure 6:
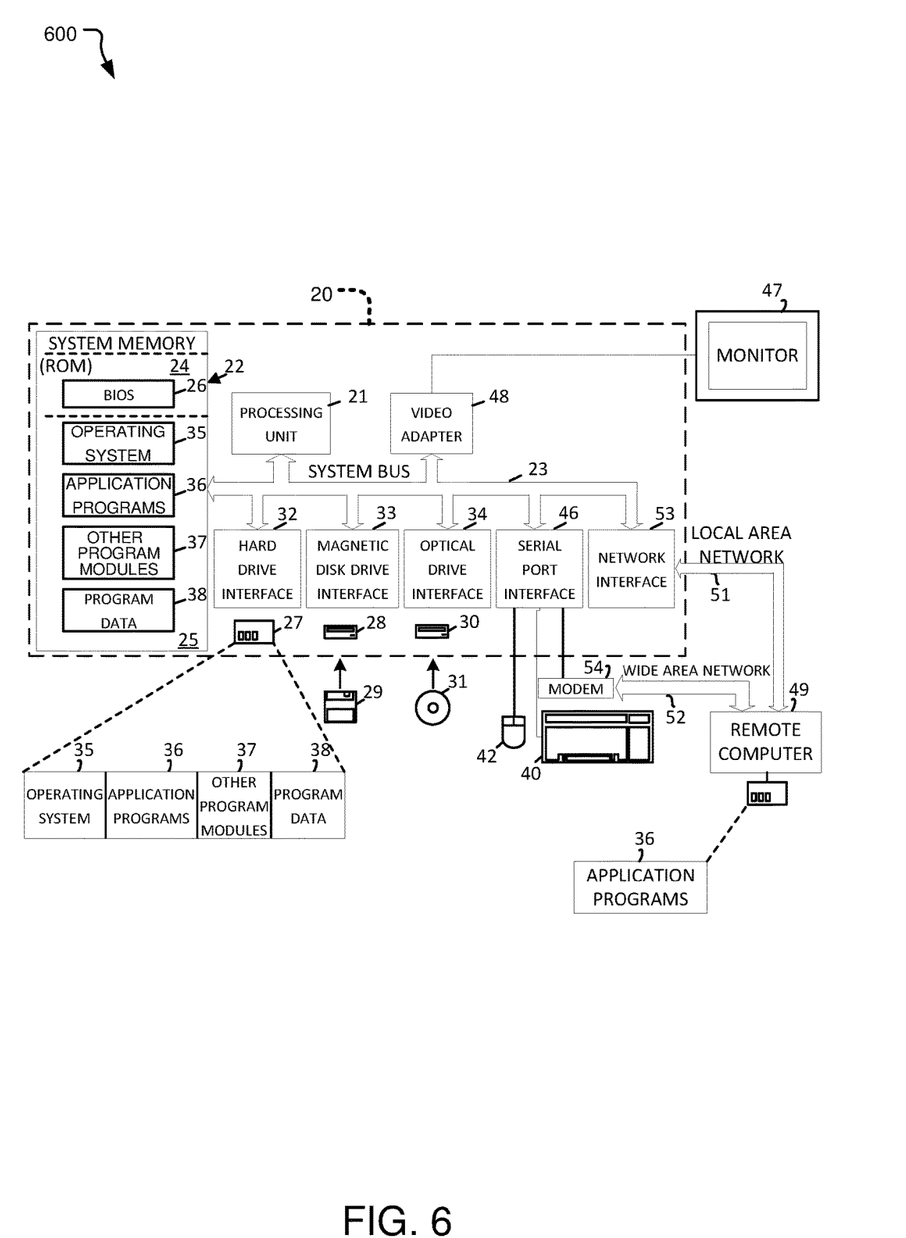
FIG. 6 illustrates an example computing system that may be use the threaded circuit board disclosed herein.

FIG. 6 illustrates an example system 600 that may be implemented on a threaded circuit board disclosed herein. The example hardware and operating environment of FIG. 6 implemented using the described technology includes a computing device, such as a general purpose computing device in the form of a computer 20, a mobile telephone, a personal data assistant (PDA), a tablet, smart watch, gaming remote, or other type of computing device. In the implementation of FIG. 6, for example, the computer 20 includes a processing unit 21, a system memory 22, and a system bus 23 that operatively couples various system components including the system memory 22 to the processing unit 21. There may be only one or there may be more than one processing unit 21, such that the processor of computer 20 comprises a single central-processing unit (CPU), or a plurality of processing units 21, commonly referred to as a parallel processing environment. The computer 20 may be a conventional computer, a distributed computer, or any other type of computer; the implementations are not so limited. An implementation of the computer 20 may be implemented on a circuit board as disclosed herein.

The system bus 23 may be any of several types of bus structures, including a memory bus or memory controller, a peripheral bus, a switched fabric, point-to-point connections, and a local bus using any of a variety of bus architectures. The system memory 22 may also be referred to as simply the memory, and includes read only memory (ROM) 24 and random access memory (RAM) 25. A basic input/output system (BIOS) 26, containing the basic routines that help to transfer information between elements within the computer 20, such as during start-up, is stored in ROM 24. The computer 20 further includes a hard disk drive 27 for reading from and writing to a hard disk, a magnetic disk drive 28 for reading from or writing to a removable magnetic disk 29, and an optical disk drive 30 for reading from or writing to a removable optical disk 31 such as a CD ROM, DVD, or other optical media.

The hard disk drive 27, magnetic disk drive 28, and optical disk drive 30 are connected to the system bus 23 by a hard disk drive interface 32, a magnetic disk drive interface 33, and an optical disk drive interface 34, respectively. The drives and their associated tangible computer-readable media provide non-volatile storage of computer-readable instructions, data structures, program modules and other data for the computer 20. It should be appreciated by those skilled in the art that any type of tangible computer-readable media may be used in the example operating environment.

A number of program modules may be stored on the hard disk drive 27, magnetic disk 29, optical disk 31, ROM 24, or RAM 25, including an operating system 35, one or more application programs 36, other program modules 37, and program data 38. For example, one or more modules of the example system 600 may be implemented on the threaded circuit board disclosed herein. A user may generate reminders on the personal computer 20 through input devices such as a keyboard 40 and pointing device 42. Other input devices may include a microphone (e.g., for voice input), a camera (e.g., for a natural user interface (NUI)), a joystick, a game pad, a satellite dish, a scanner, or the like. These and other input devices are often connected to the processing unit 21 through a serial port interface 46 that is coupled to the system bus 23, but may be connected by other interfaces, such as a parallel port, game port, or a universal serial bus (USB). A monitor 47 or other type of display device is also connected to the system bus 23 via an interface, such as a video adapter 48. In addition to the monitor 47, computers typically include other peripheral output devices, such as speakers and printers.

The computer 20 may operate in a networked environment using logical connections to one or more remote computers, such as remote computer 49. These logical connections are achieved by a communication device coupled to or a part of the computer 20; the implementations are not limited to a particular type of communications device. The remote computer 49 may be another computer, a server, a router, a network PC, a client, a peer device or other common network node, and typically includes many or all of the elements described above relative to the computer 20. The logical connections depicted in FIG. 6 include a local-area network (LAN) 51 and a wide-area network (WAN) 52. Such networking environments are commonplace in office networks, enterprise-wide computer networks, intranets and the Internet, which are all types of networks.

When used in a LAN-networking environment, the computer 20 is connected to the local area network 51 through a network interface or adapter 53, which is one type of communications device. When used in a WAN-networking environment, the computer 20 typically includes a modem 54, a network adapter, a type of communications device, or any other type of communications device for establishing communications over the wide area network 52. The modem 54, which may be internal or external, is connected to the system bus 23 via the serial port interface 46. In a networked environment, program engines depicted relative to the personal computer 20, or portions thereof, may be stored in the remote memory storage device. It is appreciated that the network connections shown are examples and other means of communications devices for establishing a communications link between the computers may be used.

In contrast to tangible computer-readable storage media, intangible computer-readable communication signals may embody computer readable instructions, data structures, program modules or other data resident in a modulated data signal, such as a carrier wave or other signal transport mechanism. The term "modulated data signal" means a signal that has one or more of its characteristics set or changed in such a manner as to encode information in the signal. By way of example, and not limitation, intangible communication signals include wired media such as a wired network or direct-wired connection, and wireless media such as acoustic, RF, infrared and other wireless media.

Some implementations may comprise an article of manufacture. An article of manufacture may comprise a tangible storage medium to store logic. Examples of a storage medium may include one or more types of computer-readable storage media capable of storing electronic data, including volatile memory or non-volatile memory, removable or non-removable memory, erasable or non-erasable memory, writeable or re-writeable memory, and so forth. Examples of the logic may include various software elements, such as software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. In one implementation, for example, an article of manufacture may store executable computer program instructions that, when executed by a computer, cause the computer to perform methods and/or operations in accordance with the described implementations. The executable computer program instructions may include any suitable type of code, such as source code, compiled code, interpreted code, executable code, static code, dynamic code, and the like. The executable computer program instructions may be implemented according to a predefined computer language, manner or syntax, for instructing a computer to perform a certain function. The instructions may be implemented using any suitable high-level, low-level, object-oriented, visual, compiled and/or interpreted programming language.

A circuit board disclosed herein includes a threaded receptor configured to receive a threaded connector of a component, one or more pads, each of the one or more pads configured to communicatively connect to a connector pin located on the component, and one or more alignment holes, each of the one or more alignment holes configured to receive an alignment pin located on the component. In one implementation, the threaded receptor is configured as ground terminal of the circuit board. In another implementation, at least one of the one or more pads is connected to an electric trace. In yet another implementation, the one or more pads are configured to connect with pogo pins located on the component.

In one alternative implementation, top surface of the one or more pads is electrically conductive and configured to receive an electrical signal from a connector pin located on the component. In another alternative implementation, the top surface of the one or more pads is made of material that is configured to receive optical signal from a connector pin located on the component.

A circuit component disclosed herein includes a threaded connector configured to attach the circuit component to a threaded receptor on a circuit board, one or more connector pins configured to communicatively connect with one or more pads on the circuit board, and one or more alignment pins, each of the one or more alignment pins configured to be inserted in an alignment hole located on the circuit board. In one implementation, the one or more connector pins are one or more pogo pins. In an alternative implementation, the one or more connector pins are configured to electrically connect with the one or more pads on the circuit board.

In one implementation, the one or more connector pins are configured to optically communicate with the one or more pads on the circuit board. In an alternative implementation, the threaded connector is configured as ground terminal of the circuit component. In yet another implementation, the threaded connector comprises a threaded screw with male threads on its outer surface. An implementation of the component includes a cavity configured with female threads on its internal surface, the cavity configured to receive the threaded connector.

A physical article of manufacture disclosed herein includes a circuit board with a threaded receptor configured to receive a threaded connector and one or more alignment holes, each of the one or more alignment holes configured to receive an alignment pin and a circuit component with a threaded connector configured to attach the circuit component to the threaded receptor on the circuit board. In an alternative implementation of the physical article of manufacture, the circuit component further includes one or more alignment pins, each of the one or more alignment pins configured to be inserted in one of the one or more alignment holes of the circuit board.

In one implementation, the circuit board further includes one or more pads, each of the one or more pads configured to communicatively connect to a connector pin located on the component. In yet another implementation, the circuit component includes the connector pin. In another implementation, the connector pin is configured to electrically connect with one of the one or more pads on the circuit board. In an alternative implementation, the connector pin is configured to optically communicate with one of the one or more pads on the circuit board.

The implementations described herein are implemented as logical steps in one or more computer systems. The logical operations may be implemented (1) as a sequence of processor-implemented steps executing in one or more computer systems and (2) as interconnected machine or circuit modules within one or more computer systems. The implementation is a matter of choice, dependent on the performance requirements of the computer system being utilized. Accordingly, the logical operations making up the implementations described herein are referred to variously as operations, steps, objects, or modules. Furthermore, it should be understood that logical operations may be performed in any order, unless explicitly claimed otherwise or a specific order is inherently necessitated by the claim language. The above specification, examples, and data, together with the attached appendices, provide a complete description of the structure and use of exemplary implementations.

The above specification, examples, and data provide a complete description of the structure and use of exemplary implementations of the invention. Since many implementations of the invention can be made without departing from the spirit and scope of the invention, the invention resides in the claims hereinafter appended. Furthermore, structural features of the different implementations may be combined in yet another implementation without departing from the recited claims.

What is claimed is:

1. A circuit board comprising:
   a threaded receptor configured within the circuit board to receive a threaded connector of a component, wherein the threaded receptor is configured as ground terminal of the circuit board;

one or more pads, each of the one or more pads configured to communicatively connect to a connector pin located on the component; and one or more alignment holes, each of the one or more alignment holes configured to receive an alignment pin located on the component.

2. The circuit board of claim 1, wherein at least one of the one or more pads is connected to an electric trace.

3. The circuit board of claim 1, wherein the one or more pads are configured to connect with pogo pins located on the component.

4. The circuit board of claim 1, wherein top surface of the one or more pads is electrically conductive and configured to receive an electrical signal from the connector pin located on the component.

5. The circuit board of claim 1, wherein the top surface of the one or more pads is made of material that is configured to receive an optical signal from the connector pin located on the component.

6. A circuit component comprising:
a threaded connector configured to attach the circuit component to a threaded receptor on a circuit board, wherein the threaded receptor is configured as a power terminal of the circuit board; and
one or more connector pins irremovably configured on the threaded connector to communicatively connect with one or more pads on the circuit board.

7. The circuit component of claim 6, wherein the one or more connector pins are one or more pogo pins.

8. The circuit component of claim 6, wherein the one or more connector pins are configured to electrically connect with the one or more pads on the circuit board.

9. The circuit component of claim 6, wherein the one or more connector pins are configured to optically communicate with the one or more pads on the circuit board.

10. The circuit component of claim 6, further comprising one or more alignment pins, each of the one or more alignment pins configured to be inserted in an alignment hole located on the circuit board.

11. The circuit component of claim 6, wherein the threaded connector comprises a threaded screw with male threads on its outer surface.

12. The circuit component of claim 6, further comprising a cavity configured with female threads on its internal surface, the cavity configured to receive the threaded connector.

13. A physical article of manufacture comprising:
a circuit board with a threaded receptor configured to receive a threaded connector and one or more alignment holes, wherein the threaded receptor is configured as a ground terminal of the circuit board; and
a circuit component with a threaded connector, wherein the threaded connector is configured to attach the circuit component to the threaded receptor on the circuit board.

14. The physical article of manufacture of claim 13, wherein the circuit component further comprising one or more alignment pins, each of the one or more alignment pins configured to be inserted in one of the one or more alignment holes of the circuit board.

15. The physical article of manufacture of claim 14, wherein the circuit board further comprising one or more pads, each of the one or more pads configured to communicatively connect to a connector pin located on the circuit component.

16. The physical article of manufacture of claim 15, wherein the circuit component further comprising the connector pin.

17. The physical article of manufacture of claim 15, wherein the connector pin is a pogo pin.

18. The physical article of manufacture of claim 15, wherein the connector pin is configured to electrically connect with one of the one or more pads on the circuit board.

19. The physical article of manufacture of claim 15, wherein the connector pin is configured to optically communicate with one of the one or more pads on the circuit board.

* * * * *